(12) United States Patent
Hara et al.

(10) Patent No.: US 7,855,859 B2
(45) Date of Patent: Dec. 21, 2010

(54) MAGNETORESISTIVE ELEMENT AND MAGNETIC HEAD

(75) Inventors: Shinji Hara, Tokyo (JP); Koji Shimazawa, Tokyo (JP); Yoshihiro Tsuchiya, Tokyo (JP); Tomohito Mizuno, Tokyo (JP); Tsuyoshi Ichiki, Tokyo (JP); Toshiyuki Ayukawa, Tokyo (JP)

(73) Assignee: TDK Corporation, Tokyo (JP)

( * ) Notice: Subject to any disclaimer, the term of this patent is extended or adjusted under 35 U.S.C. 154(b) by 578 days.

(21) Appl. No.: 12/005,273

(22) Filed: Dec. 27, 2007

(65) Prior Publication Data

US 2009/0168264 A1 Jul. 2, 2009

(51) Int. Cl.
*G11B 5/33* (2006.01)
(52) U.S. Cl. .................................. 360/324.1
(58) Field of Classification Search ............... 360/324, 360/324.1, 324.11, 324.12, 324.2
See application file for complete search history.

(56) References Cited

U.S. PATENT DOCUMENTS

| 6,313,973 | B1 * | 11/2001 | Fuke et al. | 360/324.1 |
| 6,490,140 | B1 * | 12/2002 | Mao et al. | 360/324.11 |
| 7,035,062 | B1 | 4/2006 | Mao et al. | |
| 7,450,350 | B2 * | 11/2008 | Carey et al. | 360/324.11 |
| 7,551,409 | B2 * | 6/2009 | Carey et al. | 360/324.12 |
| 7,623,323 | B2 * | 11/2009 | Nishioka et al. | 360/324.11 |
| 7,672,090 | B2 * | 3/2010 | Carey et al. | 360/324.12 |
| 7,782,576 | B2 * | 8/2010 | Uesugi et al. | 360/324.11 |
| 2002/0051380 | A1 | 5/2002 | Kamiguchi et al. | |
| 2005/0052788 | A1 | 3/2005 | Kamiguchi et al. | |
| 2005/0213262 | A1 | 9/2005 | Miyauchi et al. | |
| 2006/0067013 | A1 * | 3/2006 | Nishioka et al. | 360/324.11 |
| 2006/0203397 | A1 | 9/2006 | Mizuno et al. | |
| 2008/0037184 | A1 * | 2/2008 | Uesugi et al. | 360/324.11 |
| 2008/0117553 | A1 * | 5/2008 | Carey et al. | 360/324.2 |

FOREIGN PATENT DOCUMENTS

| JP | A-2002-92826 | 3/2002 |
| JP | A-2005-302938 | 10/2005 |
| JP | A-2006-80144 | 3/2006 |

* cited by examiner

*Primary Examiner*—Allen T Cao
(74) *Attorney, Agent, or Firm*—Oliff & Berridge, PLC

(57) ABSTRACT

In an MR element, first and second ferromagnetic layers are antiferromagnetically coupled to each other through a spacer layer, and have magnetizations that are in opposite directions when no external magnetic field is applied thereto and that change directions in response to an external magnetic field. The spacer layer and the second ferromagnetic layer are stacked in this order on the first ferromagnetic layer. The first ferromagnetic layer includes a plurality of ferromagnetic material layers stacked, and an insertion layer made of a nonmagnetic material and inserted between respective two of the ferromagnetic material layers that are adjacent to each other along the direction in which the layers are stacked. The ferromagnetic material layers and the spacer layer each include a component whose crystal structure is a face-centered cubic structure. The spacer layer and the insertion layer are each composed of an element having an atomic radius greater than that of at least one element constituting the ferromagnetic material layers.

8 Claims, 10 Drawing Sheets

MAGNETORESISTIVE ELEMENT AND MAGNETIC HEAD

BACKGROUND OF THE INVENTION

1. Field of the Invention

The present invention relates to a magnetoresistive element and a method of manufacturing the same, and to a thin-film magnetic head, a head assembly and a magnetic disk drive each including the magnetoresistive element.

2. Description of the Related Art

Performance improvements in thin-film magnetic heads have been sought as areal recording density of magnetic disk drives has increased. A widely used type of thin-film magnetic head is a composite thin-film magnetic head that has a structure in which a write head having an induction-type electromagnetic transducer for writing and a read head having a magnetoresistive element (that may be hereinafter referred to as MR element) for reading are stacked on a substrate.

MR elements include GMR (giant magnetoresistive) elements utilizing a giant magnetoresistive effect, and TMR (tunneling magnetoresistive) elements utilizing a tunneling magnetoresistive effect.

Read heads are required to have characteristics of high sensitivity and high output. As the read heads that satisfy such requirements, those incorporating spin-valve GMR elements or TMR elements have been mass-produced.

Spin-valve GMR elements and TMR elements each typically include a free layer, a pinned layer, a spacer layer disposed between the free layer and the pinned layer, and an antiferromagnetic layer disposed on a side of the pinned layer farther from the spacer layer. The free layer is a ferromagnetic layer having a magnetization that changes its direction in response to a signal magnetic field. The pinned layer is a ferromagnetic layer having a magnetization in a fixed direction. The antiferromagnetic layer is a layer that fixes the direction of the magnetization of the pinned layer by means of exchange coupling with the pinned layer. The spacer layer is a nonmagnetic conductive layer in spin-valve GMR elements, or is a tunnel barrier layer in TMR elements.

Read heads incorporating GMR elements include those having a CIP (current-in-plane) structure in which a current used for detecting a signal magnetic field (hereinafter referred to as a sense current) is fed in the direction parallel to the planes of the layers constituting the GMR element, and those having a CPP (current-perpendicular-to-plane) structure in which the sense current is fed in a direction intersecting the planes of the layers constituting the GMR element, such as the direction perpendicular to the planes of the layers constituting the GMR element.

Read heads each have a pair of shields sandwiching the MR element. The distance between the two shields is called a read gap length. Recently, with an increase in recording density, there have been increasing demands for a reduction in track width and a reduction in read gap length in read heads.

As an MR element capable of reducing the read gap length, there has been proposed an MR element including two ferromagnetic layers each functioning as a free layer, and a spacer layer disposed between the two ferromagnetic layers (such an MR element is hereinafter referred to as an MR element of three-layer structure), as disclosed in U.S. Pat. No. 7,035,062 B1, for example. In the MR element of three-layer structure, the two ferromagnetic layers have magnetizations that are in opposite directions when no external magnetic field is applied to the layers and that change directions in response to an external magnetic field.

In a read head incorporating the MR element of three-layer structure, a bias magnetic field is applied to the two ferromagnetic layers. The bias magnetic field changes the directions of the magnetizations of the two ferromagnetic layers so that the directions of their magnetizations each form an angle of approximately 45 degrees with respect to the direction of track width. As a result, a relative angle of approximately 90 degrees is formed between the directions of the magnetizations of the two ferromagnetic layers. When a signal magnetic field from the recording medium is applied to the read head, the relative angle between the directions of the magnetizations of the two ferromagnetic layers changes, and as a result, the resistance of the MR element changes. With this read head, it is possible to detect the signal magnetic field by detecting the resistance of the MR element.

Read heads incorporating MR elements of three-layer structure allow a greater reduction in read gap length, compared with read heads incorporating conventional GMR elements. For example, in a CPP-structure read head incorporating a conventional GMR element, the read gap length can be reduced to approximately 30 nm at the smallest. In contrast, in a CPP-structure read head incorporating an MR element of three-layer structure, the read gap length can be reduced to approximately 20 nm or smaller.

One of methods for making the magnetizations of the two ferromagnetic layers of an MR element of three-layer structure be in opposite directions when no external magnetic field is applied thereto is to antiferromagnetically couple the two ferromagnetic layers to each other through the spacer layer by means of the RKKY interaction. The technique of antiferromagnetically coupling the two ferromagnetic layers to each other by means of the RKKY interaction is utilized for a so-called synthetic pinned layer of a spin-valve GMR element.

In the case of antiferromagnetically coupling the two ferromagnetic layers to each other through the spacer layer by means of the RKKY interaction in the MR element of three-layer structure, it is required to increase the strength of the antiferromagnetic coupling between the two ferromagnetic layers so as to allow the MR element to operate with stability. The strength of the antiferromagnetic coupling depends on factors such as the material used for the two ferromagnetic layers, the thickness of the spacer layer, the state of the interface between the spacer layer and each of the ferromagnetic layers.

When an MR element of three-layer structure is used as a CPP-structure MR element, it is sometimes preferred to use such a material that the spin-dependent scattering of electrons increases in a ferromagnetic layer as the material to form the two ferromagnetic layers, in order to increase the magnetoresistance change ratio (hereinafter referred to as the MR ratio), that is, the ratio of magnetoresistance change with respect to the resistance of the MR element. However, such a material may often be one that would reduce the strength of the antiferromagnetic coupling between the two ferromagnetic layers. Therefore, in order to make the strength of the antiferromagnetic coupling between the two ferromagnetic layers sufficiently high even when such a material is used, it is desirable to achieve a maximum strength of the antiferromagnetic coupling between the two ferromagnetic layers by controlling the conditions other than the material of the two ferromagnetic layers, such as the state of the interface between the spacer layer and each of the ferromagnetic layers.

As thus described, for the MR elements of three-layer structure, there is a need for controlling the state of the interface between the spacer layer and each of the ferromagnetic layers from the viewpoint of increasing the strength of the antiferromagnetic coupling between the two ferromagnetic layers. Here, with regard to the state of the interface between the spacer layer and each of the ferromagnetic layers, a factor that would reduce the strength of the antiferromagnetic coupling between the two ferromagnetic layers is crystal lattice mismatch at the interface between one of the ferromagnetic layers formed before the spacer layer and the spacer layer formed thereon.

In a typical spin-valve GMR element, the two ferromagnetic layers sandwiching the spacer layer are not antiferromagnetically coupled to each other, and therefore it is not necessary to control the state of the interface between the spacer layer and each of the ferromagnetic layers from the above-mentioned viewpoint. For example, JP 2002-092826A discloses a spin-valve GMR element of the CPP structure having a configuration in which at least one of the pinned layer and the free layer sandwiching the spacer layer is made up of ferromagnetic layers and nonmagnetic layers that are alternately stacked. In this GMR element, the pinned layer and the free layer sandwiching the spacer layer are not antiferromagnetically coupled to each other, and therefore, as a matter of course, it is not necessary to control the state of the interface between the spacer layer and each of the ferromagnetic layers so as to increase the strength of antiferromagnetic coupling between the two ferromagnetic layers.

OBJECT AND SUMMARY OF THE INVENTION

It is an object of the present invention to provide a magnetoresistive element and a method of manufacturing the same, the magnetoresistive element including two ferromagnetic layers whose magnetizations change directions in response to an external magnetic field, and a spacer layer disposed therebetween, wherein the two ferromagnetic layers are antiferromagnetically coupled to each other through the spacer layer, the magnetoresistive element being capable of increasing the strength of the antiferromagnetic coupling between the two ferromagnetic layers, and to provide a thin-film magnetic head, a head assembly and a magnetic disk drive each including the magnetoresistive element.

A magnetoresistive element of the present invention includes first and second ferromagnetic layers, and a spacer layer made of a nonmagnetic material and disposed between the first and second ferromagnetic layers. The first and second ferromagnetic layers are antiferromagnetically coupled to each other through the spacer layer, and have magnetizations that are in opposite directions when no external magnetic field is applied thereto and that change directions in response to an external magnetic field. The spacer layer and the second ferromagnetic layer are stacked in this order on the first ferromagnetic layer. The first ferromagnetic layer includes: a plurality of ferromagnetic material layers that are stacked and are each made of a ferromagnetic material; and an insertion layer made of a nonmagnetic material and inserted between respective two of the ferromagnetic material layers that are adjacent to each other along the direction in which the layers are stacked. The plurality of ferromagnetic material layers and the spacer layer each include a component whose crystal structure is a face-centered cubic structure. The spacer layer and the insertion layer are each composed of an element having an atomic radius greater than that of at least one element constituting the ferromagnetic material layers.

In the magnetoresistive element of the present invention, the plurality of ferromagnetic material layers may include Co and Fe as the at least one element constituting the ferromagnetic material layers, the element constituting the spacer layer may be Cu, and the element constituting the insertion layer may be Zn, Al, or Cu.

A magnetoresistive element manufactured through a manufacturing method of the present invention includes first and second ferromagnetic layers, and a spacer layer made of a nonmagnetic material and disposed between the first and second ferromagnetic layers, the first and second ferromagnetic layers being antiferromagnetically coupled to each other through the spacer layer, and having magnetizations that are in opposite directions when no external magnetic field is applied thereto and that change directions in response to an external magnetic field.

The method of manufacturing the magnetoresistive element of the invention includes the steps of forming the first ferromagnetic layer; forming the spacer layer on the first ferromagnetic layer; and forming the second ferromagnetic layer on the spacer layer.

In the method of manufacturing the magnetoresistive element of the invention, the first ferromagnetic layer includes: a plurality of ferromagnetic material layers that are stacked and are each made of a ferromagnetic material; and an insertion layer made of a nonmagnetic material and inserted between respective two of the ferromagnetic material layers that are adjacent to each other along the direction in which the layers are stacked. The plurality of ferromagnetic material layers and the spacer layer each include a component whose crystal structure is a face-centered cubic structure. The spacer layer and the insertion layer are each composed of an element having an atomic radius greater than that of at least one element constituting the ferromagnetic material layers.

A thin-film magnetic head of the present invention includes: a medium facing surface that faces toward a recording medium; and the magnetoresistive element of the invention disposed near the medium facing surface to detect a signal magnetic field sent from the recording medium.

A head assembly of the present invention includes: a slider including the thin-film magnetic head of the invention and disposed to face toward the recording medium; and a supporter flexibly supporting the slider.

A magnetic disk drive of the present invention includes: a slider including the thin-film magnetic head of the invention and disposed to face toward the recording medium that is driven to rotate; and an alignment device supporting the slider and aligning the slider with respect to the recording medium.

According to the present invention, the spacer layer is composed of an element having an atomic radius greater than that of at least one element constituting the ferromagnetic material layers of the first ferromagnetic layer. Furthermore, according to the present invention, the first ferromagnetic layer includes the insertion layer inserted between respective two of the ferromagnetic material layers that are adjacent to each other along the direction in which the layers are stacked, and the insertion layer is composed of an element having an atomic radius greater than that of the at least one element constituting the ferromagnetic material layers. According to the present invention, it is possible that the lattice constant of the first ferromagnetic layer near the interface between the first ferromagnetic layer and the spacer layer is made closer to the lattice constant of the spacer layer, and as a result, it is possible to suppress crystal lattice mismatch between the first ferromagnetic layer and the spacer layer. The present invention thereby makes it possible to increase the strength of the antiferromagnetic coupling between the two ferromagnetic layers.

Other and further objects, features and advantages of the invention will appear more fully from the following description.

DETAILED DESCRIPTION OF THE PREFERRED EMBODIMENT

Figure 1:
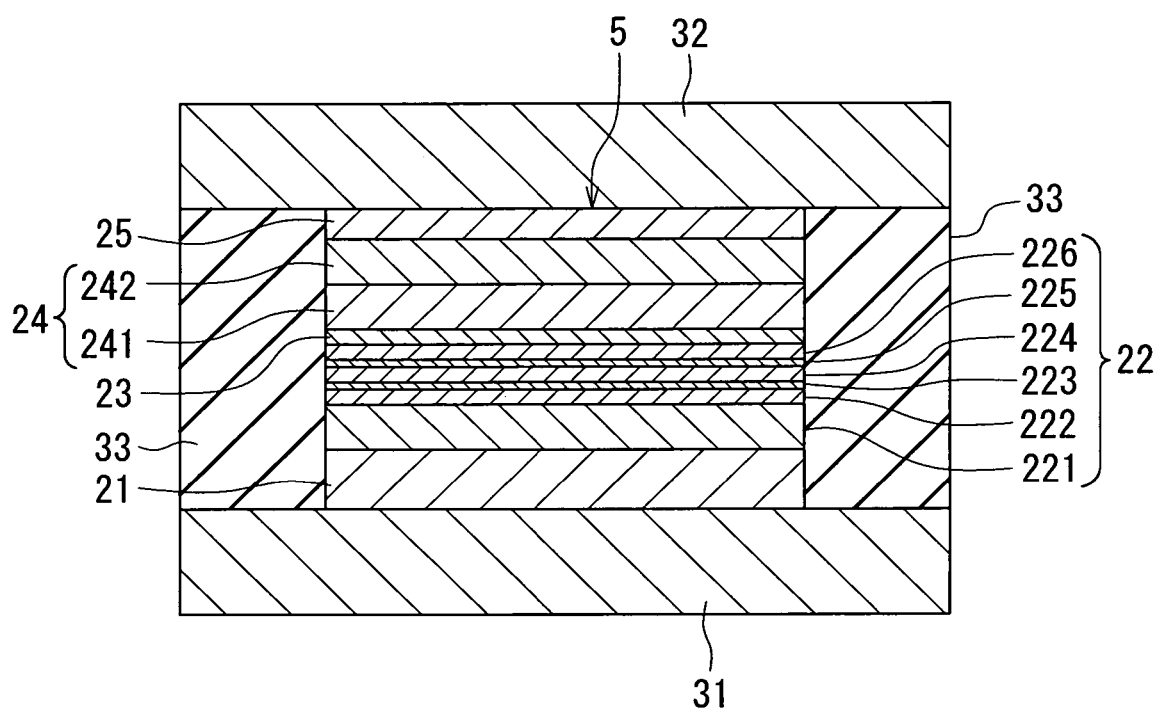
FIG. 1 is a cross-sectional view of a magnetoresistive element of an embodiment of the invention.

An embodiment of the present invention will now be described in detail with reference to the drawings. Reference is first made to FIG. 1 to describe the configuration of a magnetoresistive element (hereinafter referred to as MR element) of the embodiment of the invention. FIG. 1 is a cross-sectional view of the MR element of the embodiment. As shown in FIG. 1, the MR element 5 of the embodiment is disposed between a lower electrode layer 31 and an upper electrode layer 32 each made of a conductive material.

The MR element 5 includes a first ferromagnetic layer 22, a second ferromagnetic layer 24, and a spacer layer 23 made of a nonmagnetic material and disposed between the ferromagnetic layers 22 and 24. The spacer layer 23 and the second ferromagnetic layer 24 are stacked in this order on the first ferromagnetic layer 22. The MR element 5 further includes an underlayer 21 disposed between the lower electrode layer 31 and the first ferromagnetic layer 22, and a protection layer 25 disposed between the second ferromagnetic layer 24 and the upper electrode layer 32. An insulating layer 33 is disposed around the MR element 5 between the lower electrode layer 31 and the upper electrode layer 32.

The underlayer 21 is provided for improving the crystallinity and orientability of the first ferromagnetic layer 22 formed thereon. The protection layer 25 is made of a nonmagnetic material, and provided for protecting the second ferromagnetic layer 24 located therebelow.

The first ferromagnetic layer 22 and the second ferromagnetic layer 24 are antiferromagnetically coupled to each other through the spacer layer 23 by means of the RKKY interaction. As a result, the ferromagnetic layers 22 and 24 have magnetizations that are in opposite directions when no external magnetic field is applied thereto and that change directions in response to an external magnetic field. The spacer layer 23 is made of a nonmagnetic conductive material containing at least one selected from the group consisting of Ru, Rh, Ir, Re, Cr, Zr and Cu, for example.

The first ferromagnetic layer 22 includes: a plurality of ferromagnetic material layers that are stacked and are each made of a ferromagnetic material; and an insertion layer inserted between respective two of the ferromagnetic material layers that are adjacent to each other along the direction in which the layers are stacked. FIG. 1 illustrates an example of configuration of the first ferromagnetic layer 22. In this example the first ferromagnetic layer 22 includes an underlying magnetic material layer 221, a ferromagnetic material layer 222, an insertion layer 223, a ferromagnetic material layer 224, an insertion layer 225, and a ferromagnetic material layer 226, which are stacked in this order on the underlayer 21. The underlying magnetic material layer 221 and the ferromagnetic material layers 222, 224 and 226 are each made of a ferromagnetic material. The insertion layers 223 and 225 are each made of a nonmagnetic material. Thus, in the example shown in FIG. 1, the first ferromagnetic layer 22 includes the three ferromagnetic material layers 222, 224 and 226, and the two insertion layers 223 and 225. However, the first ferromagnetic layer 22 can have any other configuration as long as it includes at least two ferromagnetic material layers and an insertion layer inserted therebetween.

In the present embodiment, the underlying magnetic material layer 221 and the ferromagnetic material layers 222, 224 and 226 each include a component whose crystal structure is a face-centered cubic structure (hereinafter referred to as an fcc structure). In each of the underlying magnetic material layer 221 and the ferromagnetic material layers 222, 224 and 226, the component whose crystal structure is an fcc structure is preferably the main component. The underlying magnetic material layer 221 and the ferromagnetic material layers 222, 224 and 226 may each be composed only of the component whose crystal structure is an fcc structure.

In the present embodiment, the spacer layer 23 also includes a component whose crystal structure is an fcc structure. In the spacer layer 23 the component whose crystal structure is an fcc structure is preferably the main component. The spacer layer 23 may be composed only of the component whose crystal structure is an fcc structure.

In the example shown in FIG. 1, the second ferromagnetic layer 24 includes a first layer 241 and a second layer 242 stacked in this order on the spacer layer 23. The first layer 241 and the second layer 242 are each made of a ferromagnetic material. The second ferromagnetic layer 24 may be composed of a single layer only, or may be composed of three or more layers stacked.

In the present embodiment, each of the spacer layer 23 and the insertion layers 223 and 225 is composed of an element having an atomic radius greater than that of at least one element constituting the ferromagnetic material layers 222, 224 and 226.

For example, the element constituting the spacer layer 23 is Cu, and the ferromagnetic material layers 222, 224 and 226 each include Co and Fe as the at least one element constituting them. The atomic radii (metallic bond radii) of Co, Fe and Cu are 0.125 nm, 0.126 nm and 0.128 nm, respectively. Therefore, in this case, the atomic radius of Cu constituting the spacer layer 23 is greater than the atomic radius of each of Co and Fe that constitute each of the ferromagnetic material layers 222, 224 and 226. In this case, the element constituting each of the insertion layers 223 and 225 is preferably Zn, Al or Cu. The atomic radii (metallic bond radii) of Zn, Al and Cu are 0.137 nm, 0.143 nm and 0.128 nm, respectively. These are each greater than the atomic radius of each of Co and Fe. The reason why Zn, Al or Cu is preferable as the element constituting each of the insertion layers 223 and 225 will be described in detail later with reference to experimental results.

The MR element 5 of the present embodiment has a CPP structure. More specifically, a sense current, which is a current used for detecting a signal magnetic field, is fed by the lower electrode layer 31 and the upper electrode layer 32 in a direction intersecting the planes of the layers constituting the MR element 5, such as the direction perpendicular to the planes of the layers constituting the MR element 5.

The method of manufacturing the MR element 5 of the embodiment includes the steps of: forming the underlayer 21 on the lower electrode layer 31; forming the first ferromagnetic layer 22 on the underlayer 21; forming the spacer layer 23 on the first ferromagnetic layer 22; forming the second ferromagnetic layer 24 on the spacer layer 23; and forming the protection layer 25 on the second ferromagnetic layer 24. The first ferromagnetic layer 22 is formed by stacking the layers constituting the first ferromagnetic layer 22 one by one on the underlayer 21. The layers constituting the MR element 5 are each formed by physical vapor deposition such as sputtering.

Figure 2:
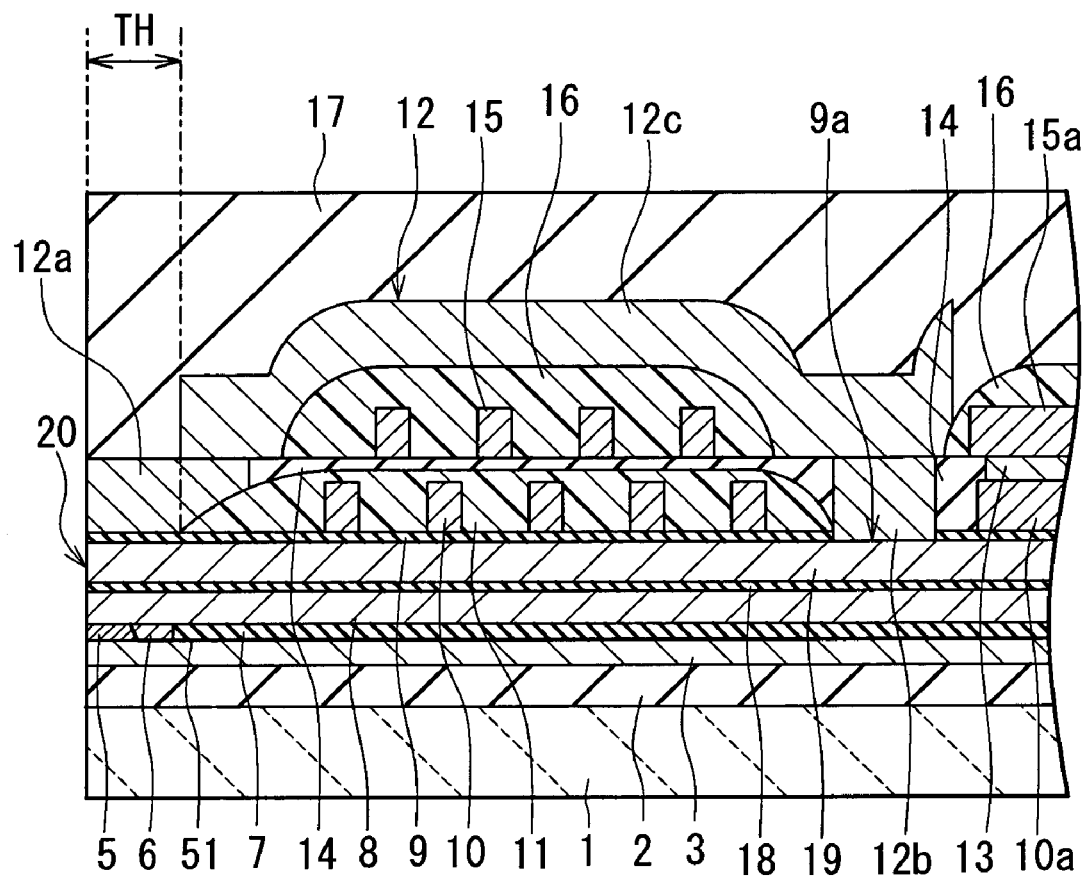
FIG. 2 is a cross-sectional view illustrating a cross section of a thin-film magnetic head of the embodiment of the invention perpendicular to the medium facing surface and a top surface of the substrate.
Figures 3, 4:
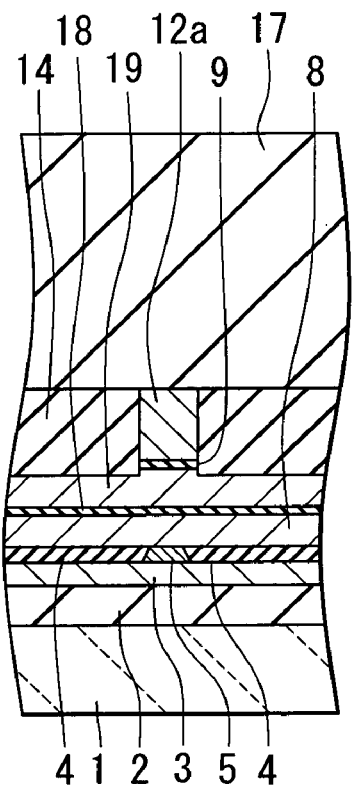
FIG. 3 is a cross-sectional view illustrating a cross section of a pole portion of the thin-film magnetic head of the embodiment of the invention parallel to the medium facing surface.
FIG. 4 is an explanatory view for explaining the operation of the magnetoresistive element of the embodiment of the invention.

Reference is now made to FIG. 2 and FIG. 3 to outline the configuration and manufacturing method of a thin-film magnetic head of the present embodiment that incorporates the MR element 5 of the embodiment. FIG. 2 is a cross-sectional view illustrating a cross section of the thin-film magnetic head perpendicular to the medium facing surface and the top surface of the substrate. FIG. 3 is a cross-sectional view illustrating a cross section of a pole portion of the thin-film magnetic head parallel to the medium facing surface.

The thin-film magnetic head of the embodiment has a medium facing surface 20 that faces toward a recording medium. The thin-film magnetic head includes: a substrate 1 made of a ceramic material such as aluminum oxide and titanium carbide ($Al_2O_3$—TiC); an insulating layer 2 made of an insulating material such as alumina ($Al_2O_3$) and disposed on the substrate 1; a first shield 3 made of a magnetic material and disposed on the insulating layer 2; and the MR element 5, refill layers 4, an insulating film 51, a bias magnetic field applying layer 6, and an insulating layer 7 that are disposed above the first shield 3. The magnetic material used for the first shield 3 is a soft magnetic material such as NiFe, CoFe, CoFeB, CoFeNi, or FeN. The first shield 3 also functions as the lower electrode layer 31 of FIG. 1.

The MR element 5 has a bottom surface touching the first shield 3, a top surface opposite to the bottom surface, a front end face located in the medium facing surface 20, a rear end face opposite to the front end face, and two side surfaces located on opposite sides in the track width direction (the horizontal direction in FIG. 3). The refill layers 4 are disposed adjacent to the two side surfaces of the MR element 5. The insulating film 51 is disposed to touch the rear end face of the MR element 5 and the top surface of the first shield 3. The bias magnetic field applying layer 6 is disposed adjacent to the rear end face of the MR element 5, with the insulating film 51 located therebetween. The insulating layer 7 is disposed on the insulating film 51 in a region on a side of the bias magnetic field applying layer 6 farther from the medium facing surface 20. The refill layers 4, the insulating film 51 and the insulating layer 7 are made of an insulating material such as alumina.

The thin-film magnetic head further includes: a second shield 8 made of a magnetic material and disposed above the MR element 5, the refill layers 4, the insulating film 51, the bias magnetic field applying layer 6 and the insulating layer 7; a separating layer 18 made of a nonmagnetic material such as alumina and disposed on the second shield 8; and a bottom pole layer 19 made of a magnetic material and disposed on the separating layer 18. The magnetic material used for the second shield 8 and the bottom pole layer 19 is a soft magnetic material such as NiFe, CoFe, CoFeB, CoFeNi or FeN. The second shield 8 also functions as the upper electrode layer 32 of FIG. 1. Alternatively, a second shield that also functions as a bottom pole layer may be provided in place of the second shield 8, the separating layer 18 and the bottom pole layer 19. The portion from the first shield 3 to the second shield 8 constitutes a read head of the thin-film magnetic head of the embodiment.

The thin-film magnetic head further includes a write gap layer 9 made of a nonmagnetic material such as alumina and disposed on the bottom pole layer 19. A contact hole 9a is formed in a region of the write gap layer 9 away from the medium facing surface 20.

The thin-film magnetic head further includes a first layer portion 10 of a thin-film coil disposed on the write gap layer 9. The first layer portion 10 is made of a conductive material such as copper (Cu). In FIG. 2 the reference numeral 10a indicates a connecting portion of the first layer portion 10 connected to a second layer portion 15 of the thin-film coil to be described later. The first layer portion 10 is wound around the contact hole 9a.

The thin-film magnetic head further includes: an insulating layer 11 made of an insulating material and disposed to cover the first layer portion 10 of the thin-film coil and the write gap layer 9 around the first layer portion 10; a top pole layer 12 made of a magnetic material; and a connecting layer 13 made of a conductive material and disposed on the connecting portion 10a. The connecting layer 13 may be made of a magnetic material. Each of the outer and the inner edge portion of the insulating layer 11 is in the shape of a rounded slope.

The top pole layer 12 includes a track width defining layer 12a, a coupling portion layer 12b and a yoke portion layer 12c. The track width defining layer 12a is disposed on the write gap layer 9 and the insulating layer 11 over a region extending from a sloped portion of the insulating layer 11 closer to the medium facing surface 20 to the medium facing surface 20. The track width defining layer 12a includes: a front-end portion that is formed on the write gap layer 9 and functions as the pole portion of the top pole layer 12; and a connecting portion that is formed on the sloped portion of the insulating layer 11 closer to the medium facing surface 20 and is connected to the yoke portion layer 12c. The front-end portion has a width equal to the write track width. The connecting portion has a width greater than the width of the front-end portion.

The coupling portion layer 12b is disposed on a region of the bottom pole layer 19 where the contact hole 9a is formed. The yoke portion layer 12c couples the track width defining layer 12a and the coupling portion layer 12b to each other. An end of the yoke portion layer 12c that is closer to the medium facing surface 20 is located at a distance from the medium facing surface 20. The yoke portion layer 12c is connected to the bottom pole layer 19 through the coupling portion layer 12b.

The thin-film magnetic head further includes an insulating layer 14 made of an inorganic insulating material such as alumina and disposed around the coupling portion layer 12b. The track width defining layer 12a, the coupling portion layer 12b, the connecting layer 13 and the insulating layer 14 have flattened top surfaces.

The thin-film magnetic head further includes the second layer portion 15 of the thin-film coil disposed on the insulating layer 14. The second layer portion 15 is made of a conductive material such as copper (Cu). In FIG. 2 the reference numeral 15a indicates a connecting portion of the second layer portion 15 that is connected to the connecting portion 10a of the first layer portion 10 of the thin-film coil through the connecting layer 13. The second layer portion 15 is wound around the coupling portion layer 12b.

The thin-film magnetic head further includes an insulating layer 16 disposed to cover the second layer portion 15 of the thin-film coil and the insulating layer 14 around the second layer portion 15. Each of the outer and the inner edge portion of the insulating layer 16 is in the shape of a rounded slope. Part of the yoke portion layer 12c is disposed on the insulating layer 16.

The thin-film magnetic head further includes an overcoat layer 17 disposed to cover the top pole layer 12. The overcoat layer 17 is made of alumina, for example. The portion from the bottom pole layer 19 to the top pole layer 12 constitutes a write head of the thin-film magnetic head of the embodiment.

The method of manufacturing the thin-film magnetic head of the embodiment will now be outlined. In the method of manufacturing the thin-film magnetic head of the embodiment, first, components of a plurality of thin-film magnetic heads are formed on a single substrate (wafer) to thereby fabricate a substructure in which pre-slider portions each of which is to become a slider later are aligned in a plurality of rows. Next, the substructure is cut to form a slider aggregate including a plurality of pre-slider portions aligned in a row. Next, a surface formed in the slider aggregate by cutting the substructure is lapped to thereby form the medium facing surfaces 20 of the pre-slider portions included in the slider aggregate. Next, flying rails are formed in the medium facing surfaces 20. Next, the slider aggregate is cut so as to separate the plurality of pre-slider portions from one another, whereby a plurality of sliders respectively including the thin-film magnetic heads are formed.

Focusing attention on one thin-film magnetic head, the method of manufacturing the thin-film magnetic head of the embodiment will now be described in detail. In this method, first, the insulating layer 2 is formed to have a thickness of 0.2 to 5 μm, for example, on the substrate 1 by sputtering or the like. Next, on the insulating layer 2, the first shield 3 is formed into a predetermined pattern by plating, for example. Next, although not shown, an insulating layer made of alumina, for example, is formed over the entire surface. Next, the insulating layer is polished by chemical mechanical polishing (hereinafter referred to as CMP), for example, until the first shield 3 is exposed, and the top surfaces of the first shield 3 and the insulating layer are thereby flattened.

Next, the MR element 5, the refill layers 4, the insulating film 51, the bias magnetic field applying layer 6 and the insulating layer 7 are formed. Next, the second shield 8 is formed. The second shield 8 is formed by plating or sputtering, for example. Next, the separating layer 18 is formed on the second shield 8 by sputtering, for example. Next, the bottom pole layer 19 is formed on the separating layer 18 by plating or sputtering, for example.

Next, on the bottom pole layer 19 the write gap layer 9 is formed to have a thickness of 50 to 300 nm, for example, by sputtering or the like. Next, in order to make a magnetic path, the contact hole 9a is formed by partially etching the write gap layer 9 at a center portion of the thin-film coil to be formed later.

Next, the first layer portion 10 of the thin-film coil is formed to have a thickness of 2 to 3 μm, for example, on the write gap layer 9. The first layer portion 10 is wound around the contact hole 9a.

Next, the insulating layer 11 made of an organic insulating material is formed into a predetermined pattern to cover the first layer portion 10 of the thin-film coil and the write gap layer 9 disposed around the first layer portion 10. The organic insulating material used for the insulating layer 11 is a material that exhibits fluidity with an increase in temperature and thereafter hardens, such as photoresist. Next, the insulating layer 11 is subjected to heat treatment so as to flatten the surface of the insulating layer 11 and to harden the insulating layer 11. Through this heat treatment, the outer and the inner edge portion of the insulating layer 11 are each brought into the shape of a rounded slope.

Next, the track width defining layer 12a of the top pole layer 12 is formed on the write gap layer 9 and the insulating layer 11 over the region extending from the sloped portion of the insulating layer 11 closer to the medium facing surface 20 described later to the medium facing surface 20.

When the track width defining layer 12a is formed, the coupling portion layer 12b is formed on the region of the bottom pole layer 19 where the contact hole 9a is formed, and the connecting layer 13 is formed on the connecting portion 10a at the same time.

Next, pole trimming is performed. That is, in a region around the track width defining layer 12a, the write gap layer 9 and at least part of the pole portion of the bottom pole layer 19 closer to the write gap layer 9 are etched using the track width defining layer 12a as a mask. This provides a trim structure in which, as shown in FIG. 3, the pole portion of the top pole layer 12, the write gap layer 9, and at least part of the pole portion of the bottom pole layer 19 have equal widths. The trim structure allows prevention of an increase in effective track width resulting from an expansion of magnetic flux near the write gap layer 9.

Next, the insulating layer 14 is formed to have a thickness of 3 to 4 μm, for example, over the entire top surface of a stack of the layers that have been formed through the foregoing steps. Next, the insulating layer 14 is polished by CMP, for example, to reach the surfaces of the track width defining layer 12a, the coupling portion layer 12b and the connecting layer 13, and is thereby flattened.

Next, the second layer portion 15 of the thin-film coil is formed to have a thickness of 2 to 3 μm, for example, on the insulating layer 14 thus flattened. The second layer portion 15 is wound around the coupling portion layer 12b.

Next, the insulating layer 16 made of an organic insulating material is formed into a predetermined pattern to cover the second layer portion 15 of the thin-film coil and the insulating layer 14 disposed around the second layer portion 15. The organic insulating material used for the insulating layer 16 is a material that exhibits fluidity with an increase in temperature and thereafter hardens, such as photoresist. Next, the insulating layer 16 is subjected to heat treatment so as to flatten the surface of the insulating layer 16 and to harden the insulating layer 16. Through this heat treatment, the outer and the inner edge portion of the insulating layer 16 are each brought into the shape of a rounded slope. Next, the yoke portion layer 12c is formed on the track width defining layer 12a, the insulating layers 14 and 16 and the coupling portion layer 12b.

Next, the overcoat layer 17 is formed to cover the entire top surface of a stack of the layers that have been formed through the foregoing steps. Wiring, terminals and so on are then formed on the overcoat layer 17. The substructure is thereby fabricated. Subsequently, as previously described, the substructure is cut to form the slider aggregate. Next, a surface formed in the slider aggregate by cutting the substructure is lapped to thereby form the medium facing surfaces 20 for the pre-slider portions included in the slider aggregate. Next, flying rails are formed in the medium facing surfaces 20. Next, the slider aggregate is cut so as to separate the plurality of pre-slider portions from one another, whereby a plurality of sliders each of which includes the thin-film magnetic head are formed.

The thin-film magnetic head manufactured in this manner has the medium facing surface 20 that faces toward the recording medium, the read head, and the write head. The thin-film magnetic head writes data on the recording medium through the use of the write head and reads data written on the recording medium through the use of the read head. The read head incorporates the MR element 5 of the embodiment.

The write head includes: the bottom pole layer 19 and the top pole layer 12 magnetically coupled to each other and including the respective pole portions that are opposed to each other and placed in regions of the pole layers on a side of the medium facing surface 20; the write gap layer 9 provided between the pole portion of the bottom pole layer 19 and the pole portion of the top pole layer 12; and the thin-film coil 10, 15 at least part of which is placed between the bottom pole layer 19 and the top pole layer 12 and insulated from the bottom pole layer 19 and the top pole layer 12. In this thin-film magnetic head, as illustrated in FIG. 2, the length from the medium facing surface 20 to the end of the insulating layer 11 closer to the medium facing surface 20 is the throat height TH. Note that the throat height refers to a length (height) from the medium facing surface 20 to a point at which the distance between the two pole layers starts to increase. It should be noted that, while FIG. 2 and FIG. 3 illustrate a write head for use with the longitudinal magnetic recording system, the write head of the embodiment can be one for use with the perpendicular magnetic recording system.

Reference is now made to FIG. 4 to describe the operation of the MR element 5 of the present embodiment and that of the read head including the MR element 5. FIG. 4 is an explanatory view for explaining the operation of the MR element 5. In FIG. 4 each arrow in the item "External magnetic field intensity" indicates the direction of the external magnetic field with the direction of the arrow, and indicates the intensity of the external magnetic field with the length of the arrow. In the item "Magnetization direction" in FIG. 4, each dotted-line arrow indicates the direction of the magnetization of the first ferromagnetic layer 22, and each solid-line arrow indicates the direction of the magnetization of the second ferromagnetic layer 24. The thickness of the arrow in the item "Resistance" in FIG. 4 indicates the resistance of the MR element 5.

As illustrated in FIG. 4, the directions of the magnetizations of the ferromagnetic layers 22 and 24 are opposite to each other when no external magnetic field is applied to the ferromagnetic layers 22 and 24. In this state, the resistance of the MR element 5 is maximum. When an external magnetic field is applied to the ferromagnetic layers 22 and 24, the directions of the magnetizations of the ferromagnetic layers 22 and 24 change toward the direction of the external magnetic field. As the intensity of the external magnetic field increases, the directions of the magnetizations of the ferromagnetic layers 22 and 24 get closer to the direction of the external magnetic field. When the intensity of the external magnetic field becomes equal to or greater than a specific intensity, the directions of the magnetizations of the ferromagnetic layers 22 and 24 become parallel to each other. The smaller the relative angle between the directions of the magnetizations of the ferromagnetic layers 22 and 24, the lower the resistance of the MR element 5. Here, if a bias magnetic field is applied to the ferromagnetic layers 22 and 24 so that the relative angle between the directions of the magnetizations of the ferromagnetic layers 22 and 24 becomes 90 degrees while no external magnetic field other than the bias magnetic field is applied to the ferromagnetic layers 22 and 24, the resistance of the MR element 5 will change toward both directions responsive to the direction and magnitude of an external magnetic field other than the bias magnetic field when the external magnetic field is applied to the ferromagnetic layers 22 and 24. It is therefore possible to detect the external magnetic field by detecting the resistance of the MR element 5. The bias magnetic field applying layer 6 shown in FIG. 2 is provided for applying the above-mentioned bias magnetic field to the ferromagnetic layers 22 and 24.

The resistance of the MR element 5 is determined from the potential difference between the electrode layers 31 and 32 of FIG. 1 (the shields 3 and 8 of FIG. 2 and FIG. 3) produced when a sense current is fed to the MR element 5 from the electrode layers 31 and 32. In this way, it is possible to detect the external magnetic field using the MR element 5. It is further possible, using the read head including the MR element 5, to read data stored on the recording medium.

The configuration, function and effects of the MR element 5 of the present embodiment will now be described in detail with reference to the results of a first to a third experiment.

[First Experiment]

For the first experiment, initially prepared were a plurality of samples each including the MR element 5 having the configuration shown in Table 1 below. In the following description, an NiFe alloy containing 82 atomic % Ni and 18 atomic % Fe is expressed as $Ni_{82}Fe_{18}$, and a CoFe alloy containing 90 atomic % Co and 10 atomic % Fe is expressed as $Co_{90}Fe_{10}$.

TABLE 1

| Layer | Material | Thickness (nm) |
| --- | --- | --- |
| Protection layer | Ru | 2.0 |
| Second ferromagnetic layer | $Ni_{82}Fe_{18}$ | 3.0 |
|  | $Co_{90}Fe_{10}$ | 3.0 |
| Spacer layer | Cu | y |
| First ferromagnetic layer | $Co_{90}Fe_{10}$ | 1.0 |
|  | X | 0.2 |
|  | $Co_{90}Fe_{10}$ | 1.0 |
|  | X | 0.2 |

TABLE 1-continued

| Layer | Material | Thickness (nm) |
| --- | --- | --- |
|  | $Co_{90}Fe_{10}$ | 1.0 |
|  | $Ni_{82}Fe_{18}$ | 3.0 |
| Underlayer | NiCr | 4.0 |

In the samples prepared for the first experiment, as shown in Table 1, the underlying magnetic material layer 221 was an $Ni_{82}Fe_{18}$ layer having a thickness of 3.0 nm, and each of the ferromagnetic material layers 222, 224 and 226 was a $Co_{90}Fe_{10}$ layer having a thickness of 1.0 nm. For the first experiment, further prepared were a plurality of types of samples varying in material X of the insertion layers 223 and 225. The material X is any of Zn, Al, Cu, Ga and Ge. The thickness of each of the insertion layers 223 and 225 was set to 0.2 nm. Furthermore, a plurality of samples varying in thickness "y" of the spacer layer 23 made of Cu were prepared for each of the above-listed materials X. Furthermore, for the first experiment, prepared were a plurality of samples each having such a configuration that the insertion layers 223 and 225 were eliminated from the configuration shown in Table 1, with the thickness "y" of the spacer layer 23 made of Cu varied. The value of "y" was varied within a range of 0.5 to 1.3 nm by 0.1 nm.

For the first experiment, each of the foregoing samples was prepared in the following manner. First, on the lower electrode layer 31, the layers listed in Table 1 were stacked one by one from the bottom by sputtering, whereby a layered film was formed. Next, the layered film was heat-treated at a temperature of 250° C. over three hours. Next, the MR element 5 in the shape of a column was formed by etching the layered film such that the top surface thereof was formed into the shape of a square with a side length of 100 nm. Next, the insulating layer 33 made of alumina and having a thickness of 20 nm was formed on the lower electrode layer 31 at a location around the MR element 5. Next, the upper electrode layer 32 was formed on the MR element 5 and the insulating layer 33 to complete the sample.

In the first experiment, the MR ratio of each of the samples prepared was measured while applying a magnetic field to each sample in a direction orthogonal to the direction in which the layers constituting the MR element 5 were stacked and orthogonal to the magnetization directions of the ferromagnetic layers 22 and 24 obtained when any external magnetic field including a bias magnetic field is not applied thereto. In the first experiment, the exchange coupling magnetic field Hs was determined based on the MR ratio thus measured.

Figure 5:
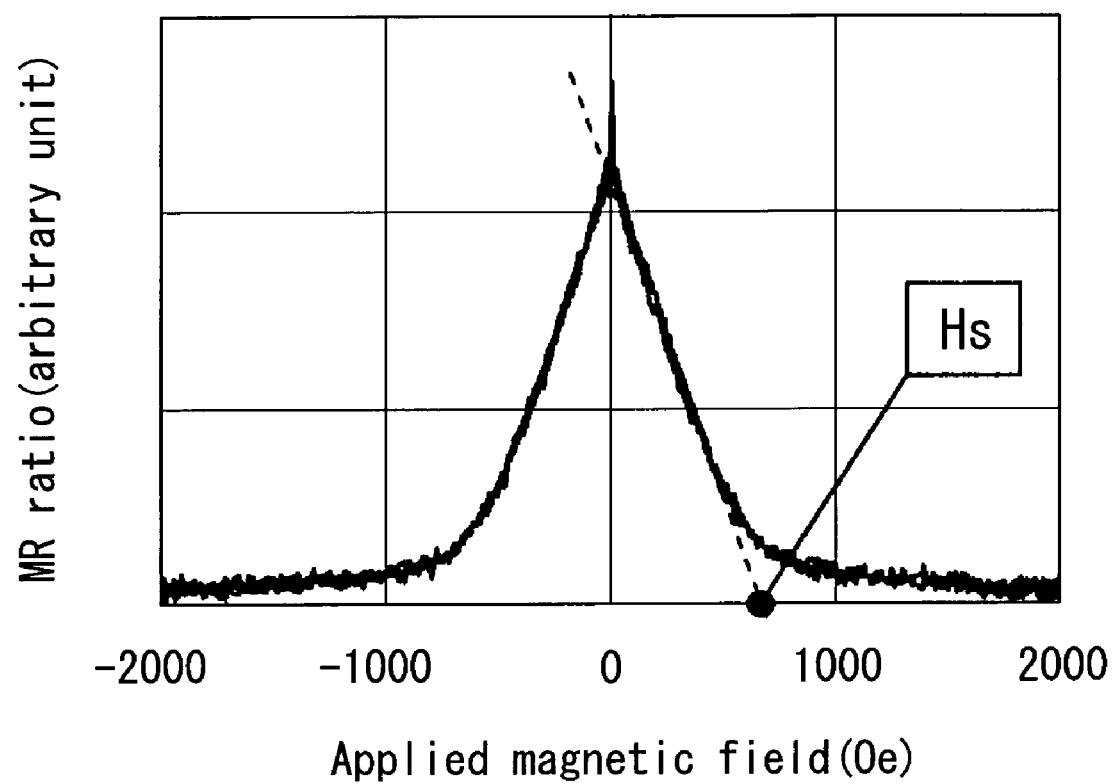
FIG. 5 is an explanatory view for explaining the method of measuring an exchange coupling magnetic field employed in a first experiment.

The exchange coupling magnetic field Hs can be determined as an applied magnetic field at a point when the antiferromagnetic coupling between the ferromagnetic layers 22 and 24 breaks, or in other words, when the magnetization directions of the ferromagnetic layers 22 and 24 become parallel to each other, in the course of increasing the magnetic field applied. Reference is now made to FIG. 5 to specifically describe the method of measuring the exchange coupling magnetic field Hs. FIG. 5 illustrates the relationship between the applied magnetic field to the sample and the MR ratio of the sample in a wave form wherein the horizontal axis indicates the applied magnetic field to the sample and the vertical axis indicates the MR ratio of the sample. In the present application, while "Oe" is used as the unit of a magnetic field, the magnitude of a magnetic field can be converted to a value in the unit of "A/m" because the relation that 1 Oe=79.6 A/m holds. As shown in FIG. 5, the MR ratio is maximum when the applied magnetic field is zero, and the MR ratio decreases nearly linearly as the absolute value of the applied magnetic field increases. When the absolute value of the applied magnetic field becomes larger and reaches a certain value, the MR ratio becomes nearly zero and hardly changes. In the first experiment, the magnitude of the applied magnetic field at the point of intersection of the following two straight lines was defined as the exchange coupling magnetic field Hs: one is the straight line indicating the zero level of the MR ratio, and the other is the straight line approximating a portion of the wave form of FIG. 5 in which the MR ratio decreases nearly linearly in the region where the applied magnetic field is of positive values.

Figure 6:
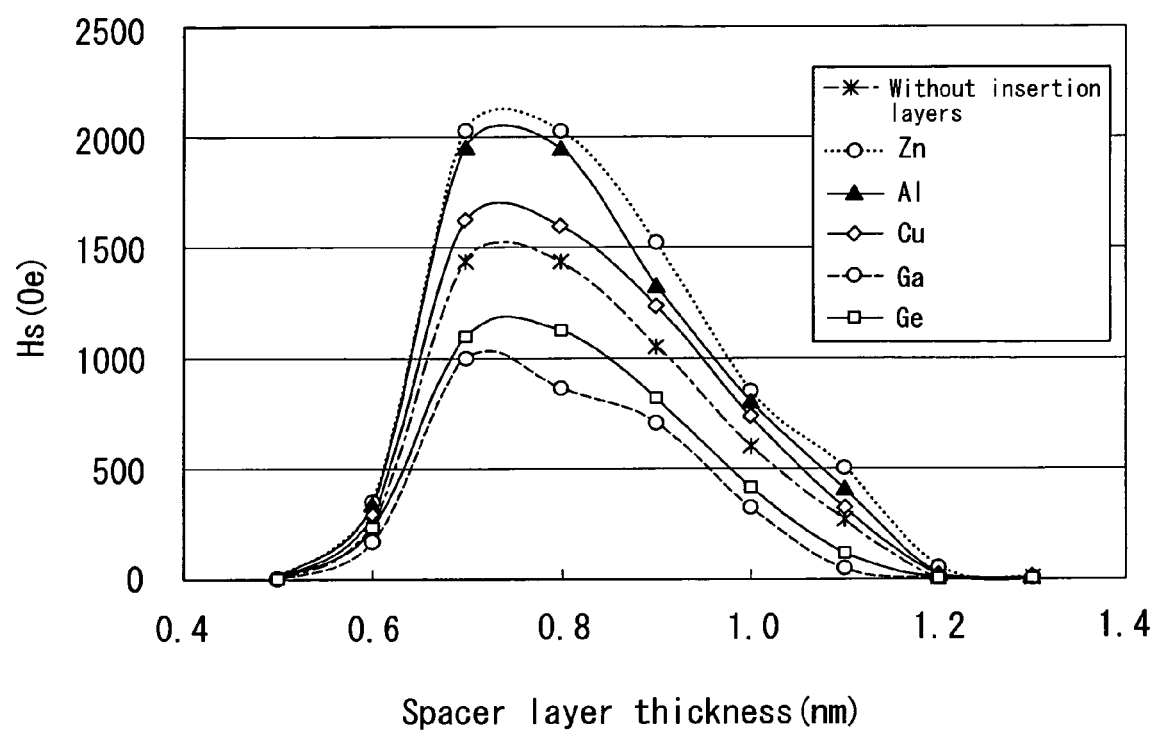
FIG. 6 is a plot illustrating the relationship between the thickness of the spacer layer and the exchange coupling magnetic field determined in the first experiment.

In the first experiment, the relationship between the thickness of the spacer layer 23 and the exchange coupling magnetic field Hs was determined for each of the case in which the insertion layers 223 and 225 were not provided and the respective cases in which the material X of the insertion layers 223 and 225 was Zn, Al, Cu, Ga, and Ge. FIG. 6 shows the results. It is known that the exchange coupling energy between two ferromagnetic layers sandwiching a Cu layer typically changes periodically in response to changes in thickness of the Cu layer. The results shown in FIG. 6 support this phenomenon. The results shown in FIG. 6 indicate that the period of change in exchange coupling magnetic field Hs in response to changes in thickness of the spacer layer 23 made of Cu does not differ among the case without the insertion layers 223 and 225 and the respective cases in which the material X of the insertion layers 223 and 225 is Zn, Al, Cu, Ga and Ge, and in every case the exchange coupling magnetic field Hs is maximum when the thickness of the spacer layer 23 is within a range of 0.7 to 0.8 nm.

The results shown in FIG. 6 further indicate that a difference in the material X of the insertion layers 223 and 225 results in either an increase or decrease in exchange coupling magnetic field Hs compared with the case without the insertion layers 223 and 225, and that a difference in the material X further results in different amounts of increase or decrease in exchange coupling magnetic field Hs compared with the case without the insertion layers 223 and 225. As shown in FIG. 6, when the material X is any of Zn, Al and Cu, the exchange coupling magnetic field Hs shows an increase compared with the case without the insertion layers 223 and 225. Among Zn, Al and Cu, Zn is capable of making the amount of increase in exchange coupling magnetic field Hs the greatest of all, Al is capable of making the amount of increase the second greatest, and Cu is capable of making the amount of increase the third greatest. When the material X is Ga or Ge, the exchange coupling magnetic field Hs shows a decrease compared with the case without the insertion layers 223 and 225.

Figure 7:
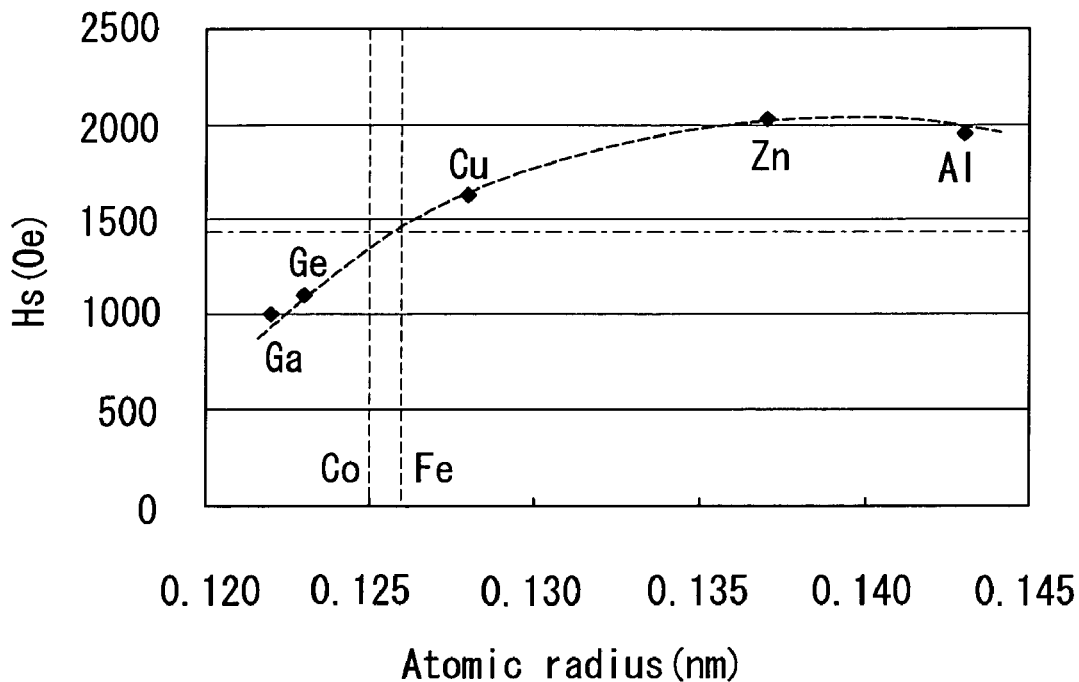
FIG. 7 is a plot illustrating the relationship between the atomic radius of the element constituting the insertion layer and the exchange coupling magnetic field determined in the first experiment.

Discussions will now be given on the reason why a difference in the material X of the insertion layers 223 and 225 results in either an increase or decrease in exchange coupling magnetic field Hs compared with the case without the insertion layers 223 and 225. FIG. 7 shows the relationship between the atomic radius (metallic bond radius) of each of Zn, Al, Cu, Ga and Ge and the exchange coupling magnetic field Hs obtained when the material X is any of Zn, Al, Cu, Ga and Ge and the spacer layer 23 is 0.7 nm in thickness. In FIG. 7 the atomic radius of each of Co and Fe that are elements constituting the ferromagnetic material layers 222, 224 and 226 is indicated with a broken line, and the exchange coupling magnetic field Hs obtained in the case without the insertion layers 223 and 225 is indicated with an alternate long and short dash line.

As can be seen from FIG. 7, when the element constituting the material X has an atomic radius greater than that of each of Co and Fe, the exchange coupling magnetic field Hs is greater compared with the case without the insertion layers 223 and 225. When the element constituting the material X has an atomic radius smaller than that of each of Co and Fe, the exchange coupling magnetic field Hs is smaller compared with the case without the insertion layers 223 and 225.

The foregoing results can be explained in a qualitative manner as follows. First, in order to allow the RKKY interaction to occur with the ferromagnetic layers 22 and 24 and the spacer layer 23, it is required that the interface between the ferromagnetic layer 22 and the spacer layer 23 and the interface between the ferromagnetic layer 24 and the spacer layer 23 be clean and that each of the layers has a good crystallinity. Here, in the case of the samples prepared for the first experiment, the lattice size of the CoFe crystal having the fcc structure that constitutes the ferromagnetic material layer 226 is different from the lattice size of the Cu crystal having the fcc structure that constitutes the spacer layer 23, and consequently there occurs a mismatch between the crystal lattice of CoFe and that of Cu at the interface between the ferromagnetic material layer 226 and the spacer layer 23. Here, it is considered that, by inserting the insertion layers 223 and 225 made of an element having an atomic radius greater than that of each of Co and Fe into the first ferromagnetic layer 22, it is possible that the lattice constant of the ferromagnetic material layer 226 in the neighborhood of the interface between the ferromagnetic material layer 226 and the spacer layer 23 is made closer to the lattice constant of the spacer layer 23 made of Cu whose atomic radius is greater than that of each of Co and Fe while the ferromagnetic material layers 222, 224 and 226 maintain the fcc structure. It is considered that this can suppress the crystal lattice mismatch at the interface between the ferromagnetic material layer 226 and the spacer layer 23, and can consequently increase the exchange coupling magnetic field Hs.

Figure 8:
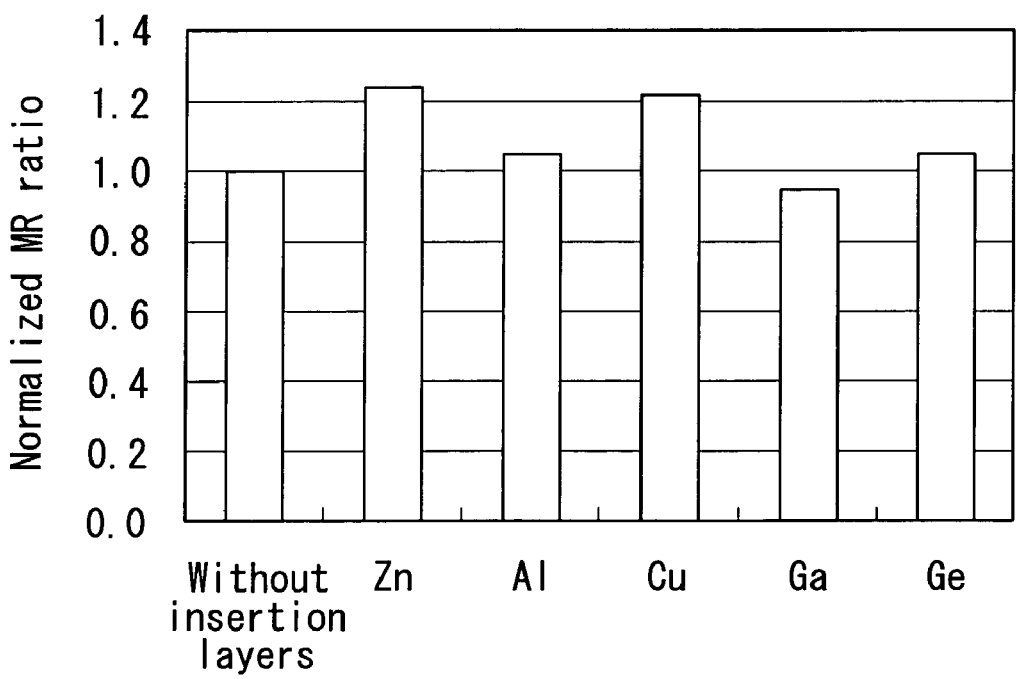
FIG. 8 is a plot illustrating the relationship between the material used to form the insertion layer and MR ratio determined in the first experiment.

In the first experiment, MR ratio was measured for each of the samples in which the spacer layer 23 had a thickness of 0.7 nm. Here, the value of the MR ratio of each of those samples divided by the MR ratio of the sample without the insertion layers 223 and 225 is defined as a normalized MR ratio. FIG. 8 shows the relationship between the material X of the insertion layers 223 and 225 and the normalized MR ratio. As shown in FIG. 8, the MR ratio greatly increased in the case in which the material X was Zn and the case in which the material X was Cu, increased to some extent in the case in which the material X was Al and the case in which the material X was Ge, and decreased in the case in which the material X was Ga, compared with the case without the insertion layers 223 and 225.

For each of the respective cases in which the material X of the insertion layers 223 and 225 was Zn, Al, Cu, Ga and Ge, Table 2 below summarizes how the exchange coupling magnetic field Hs and the MR ratio changed in comparison with the case without the insertion layers 223 and 225.

TABLE 2

| X | Hs | MR ratio |
|---|---|---|
| Zn | Greatly increased | Greatly increased |
| Al | Greatly increased | Increased to some extent |
| Cu | Increased to some extent | Greatly increased |
| Ga | Decreased | Decreased |
| Ge | Decreased | Increased to some extent |

As can be seen from Table 2, when the element constituting the insertion layers 223 and 225 is any of Zn, Al and Cu, it is possible to increase both the exchange coupling magnetic field Hs and the MR ratio, compared with the case in which the insertion layers 223 and 225 are not provided. It is therefore preferred that the element constituting the insertion layers 223 and 225 be Zn, Al or Cu.

As will be described in detail later with reference to the results of the third experiment, when forming the MR element 5 into the CPP structure for use, there are cases in which it is preferable to use CoFe having a higher Fe content than $Co_{90}Fe_{10}$ as the material of the ferromagnetic material layers 222, 224 and 226 so as to increase the MR ratio of the MR element 5. However, if CoFe having a higher Fe content is used as the material of the ferromagnetic material layers 222, 224 and 226, the crystallinity of the first ferromagnetic layer 22 deteriorates and the exchange coupling magnetic field Hs is thereby reduced. In the case of changing only the composition of CoFe as the material of the ferromagnetic material layers 222, 224 and 226, the MR ratio and the exchange coupling magnetic field Hs are in a trade-off relationship. If it is possible to greatly increase the exchange coupling magnetic field Hs by providing the insertion layers 223 and 225, it becomes possible to obtain a sufficient magnitude of exchange coupling magnetic field Hs while using a material capable of increasing the MR ratio as the material of the ferromagnetic material layers 222, 224 and 226. It is therefore particularly preferred that the element constituting the insertion layers 223 and 225 be Zn or Al, which is capable of greatly increasing the exchange coupling magnetic field Hs.

[Second Experiment]

The second experiment will now be described. For the second experiment, initially prepared were a plurality of samples each including the MR element 5 having the configuration shown in Table 3 below.

TABLE 3

| Layer | Material | Thickness (nm) |
|---|---|---|
| Protection layer | Ru | 2.0 |
| Second ferromagnetic layer | $Ni_{82}Fe_{18}$ | 3.0 |
| | $Co_{90}Fe_{10}$ | 3.0 |
| Spacer layer | Cu | 0.7 |
| First ferromagnetic layer | $Co_{90}Fe_{10}$ | 1.0 |
| | X | z |
| | $Co_{90}Fe_{10}$ | 1.0 |
| | X | z |
| | $Co_{90}Fe_{10}$ | 1.0 |
| | $Ni_{82}Fe_{18}$ | 3.0 |
| Underlayer | NiCr | 4.0 |

As shown in Table 3, in the samples prepared for the second experiment, the underlying magnetic material layer 221 was an $Ni_{82}Fe_{18}$ layer having a thickness of 3.0 nm, each of the ferromagnetic material layers 222, 224 and 226 was a $Co_{90}Fe_{10}$ layer having a thickness of 1.0 nm, and the spacer layer 23 was a Cu layer having a thickness of 0.7 nm. For the second experiment, further prepared were a plurality of types of samples varying in material X of the insertion layers 223 and 225. The material X is any of Zn, Al and Cu. Furthermore, for the second experiment, a plurality of samples varying in thickness "z" of the insertion layers 223 and 225 were prepared for each of the above-listed materials X. The value of "z" was varied within a range of 0.1 to 1.1 nm by 0.1 nm. Furthermore, for the second experiment, prepared was a reference sample having such a configuration that the insertion layers 223 and 225 were eliminated from the configuration shown in Table 3, that is, a sample in which the thickness "z"

of the insertion layers 223 and 225 was zero. The preparation method for the samples of the second experiment is the same as that for the samples of the first experiment.

Figure 9:
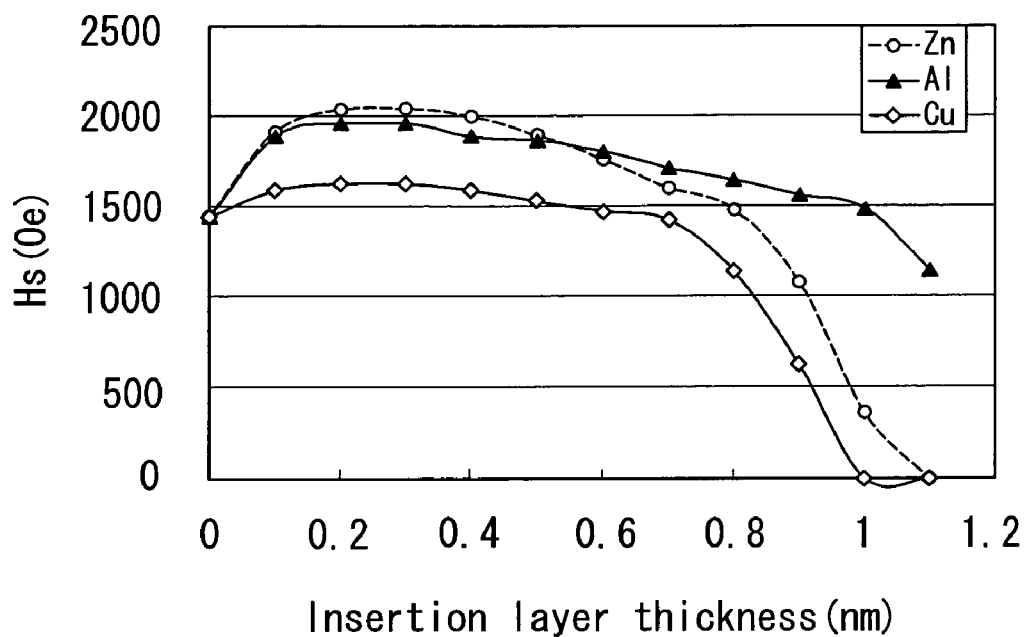
FIG. 9 is a plot illustrating the relationship between the thickness of the insertion layer and the exchange coupling magnetic field determined in a second experiment.

In the second experiment, the exchange coupling magnetic field Hs was measured for each of the samples in the same way as the first experiment. Then, the relationship between the thickness "z" of the insertion layers 223 and 225 and the exchange coupling magnetic field Hs was determined for each of the respective cases in which the material X of the insertion layers 223 and 225 was Zn, Al, and Cu. FIG. 9 shows the results. As shown in FIG. 9, compared with the case without the insertion layers 223 and 225, that is, the case in which the thickness "z" of the insertion layers 223 and 225 is zero, the exchange coupling magnetic field Hs is greater when the thickness "z" of the insertion layers 223 and 225 is within a range of 0.1 to 0.8 nm in the case in which the material X is Zn, when the thickness "z" of the insertion layers 223 and 225 is within a range of 0.1 to 1.0 nm in the case in which the material X is Al, and when the thickness "z" of the insertion layers 223 and 225 is within a range of 0.1 to 0.7 nm in the case in which the material X is Cu. These results indicate that, in the respective cases in which the material X is Zn, Al, and Cu, it is possible to make the exchange coupling magnetic field Hs greater compared with the case without the insertion layers 223 and 225, when the thickness "z" of the insertion layers 223 and 225 falls within the respective ranges mentioned above.

The exchange coupling magnetic field Hs decreases when the thickness "z" of the insertion layers 223 and 225 becomes greater than the above-mentioned ranges. The reason for this is presumably as follows. It is considered that the insertion layers 223 and 225 have a function of increasing the exchange coupling magnetic field Hs by suppressing the crystal lattice mismatch at the interface between the ferromagnetic material layer 226 and the spacer layer 23 and a function of decreasing the exchange coupling magnetic field Hs by disturbing the fcc structure of the ferromagnetic material layers 222, 224 and 226. The exchange coupling magnetic field Hs is considered to increase or decrease depending on the magnitude of these two functions. It is considered that, when the thickness "z" of the insertion layers 223 and 225 is within the above-mentioned ranges, the disturbance of the fcc structure of the ferromagnetic material layers 222, 224 and 226 is insignificant, so that the exchange coupling magnetic field Hs increases. It is considered that, when the thickness "z" of the insertion layers 223 and 225 becomes greater than the above-mentioned ranges, the disturbance of the fcc structure of the ferromagnetic material layers 222, 224 and 226 becomes significant, so that the exchange coupling magnetic field Hs decreases.

Here, the ratio of the volume of the insertion layers 223 and 225 to the total volume of the ferromagnetic material layers 222, 224 and 226 and the insertion layers 223 and 225 is defined as the volume fraction of the insertion layers. The results shown in FIG. 9 indicate the following. When the material of the ferromagnetic material layers 222, 224 and 226 is $Co_{90}Fe_{10}$ and the material of the insertion layers 223 and 225 is Zn, it is possible to make the exchange coupling magnetic field Hs greater compared with the case without the insertion layers 223 and 225, as long as the volume fraction of the insertion layers is not higher than 35 weight %. When the material of the ferromagnetic material layers 222, 224 and 226 is $Co_{90}Fe_{10}$ and the material of the insertion layers 223 and 225 is Al, it is possible to make the exchange coupling magnetic field Hs greater compared with the case without the insertion layers 223 and 225, as long as the volume fraction of the insertion layers is not higher than 40 weight %. When the material of the ferromagnetic material layers 222, 224 and 226 is $Co_{90}Fe_{10}$ and the material of the insertion layers 223 and 225 is Cu, it is possible to make the exchange coupling magnetic field Hs greater compared with the case without the insertion layers 223 and 225, as long as the volume fraction of the insertion layers is not higher than 32 weight %.

Furthermore, from FIG. 9 it can be considered that, in any of the respective cases in which the material of the insertion layers 223 and 225 is Zn, Al, and Cu, a greater exchange coupling magnetic field Hs is obtained as long as the thickness of the insertion layers 223 and 225 is greater than zero, that is, equal to or greater than the minimum thickness possible.

[Third Experiment]

The third experiment will now be described. For the third experiment, initially prepared were a plurality of samples each including the MR element 5 having the configuration shown in Table 4 below. In the following description, a CoFe alloy containing "t" atomic % Co and (100−t) atomic % Fe is expressed as $Co_tFe_{100-t}$. The Co content ("t" atomic %) of this CoFe alloy is defined here as the Co fraction. In the following description, a CoFe alloy containing 30 atomic % Co and 70 atomic % Fe is expressed as $Co_{70}Fe_{30}$.

TABLE 4

| Layer | Material | Thickness (nm) |
|---|---|---|
| Protection layer | Ru | 2.0 |
| Second ferromagnetic layer | $Ni_{82}Fe_{18}$ | 3.0 |
|  | $Co_{90}Fe_{10}$ | 3.0 |
| Spacer layer | Cu | 0.7 |
| First ferromagnetic layer | $Co_tFe_{100-t}$ | 1.0 |
|  | X | 0.2 |
|  | $Co_tFe_{100-t}$ | 1.0 |
|  | X | 0.2 |
|  | $Co_tFe_{100-t}$ | 1.0 |
|  | $Ni_{82}Fe_{18}$ | 3.0 |
| Underlayer | NiCr | 4.0 |

As shown in Table 4, in the samples prepared for the third experiment, the underlying magnetic material layer 221 was an $Ni_{82}Fe_{18}$ layer having a thickness of 3.0 nm, each of the ferromagnetic material layers 222, 224 and 226 was a $Co_tFe_{100-t}$ layer having a thickness of 1.0 nm, and the spacer layer 23 was a Cu layer having a thickness of 0.7 nm. For the third experiment, further prepared were a plurality of types of samples varying in material X of the insertion layers 223 and 225. The material X is any of Zn, Al and Cu. Furthermore, for the third experiment, a plurality of samples varying in Co fraction were prepared for each of the above-listed materials X. The value of "t" indicating the Co fraction is any of 30, 40, 50, 60, 70, 80, 90, and 100.

The preparation method for the samples of the third experiment is the same as that for the samples of the first experiment. In the third experiment, the $Co_tFe_{100-t}$ layers were each formed by sputtering $CO_{30}Fe_{70}$ and Co at the same time. However, the $Co_tFe_{100-t}$ layers may each be formed by stacking a thin film of $Co_{30}Fe_{70}$ and a thin film of Co.

Figure 10:
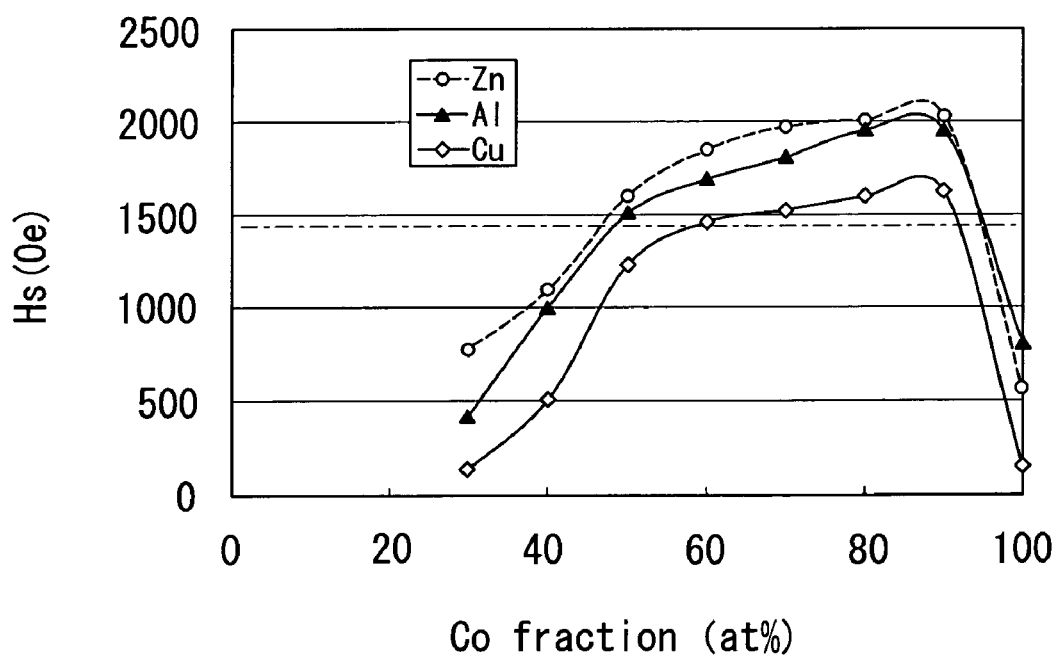
FIG. 10 is a plot illustrating the relationship between the Co fraction in the ferromagnetic material layers and the exchange coupling magnetic field determined in a third experiment.

In the third experiment, the exchange coupling magnetic field Hs was measured for each of the samples in the same way as the first experiment. Then, the relationship between the Co fraction and the exchange coupling magnetic field Hs was determined for each of the respective cases in which the material X of the insertion layers 223 and 225 was Zn, Al, and Cu. FIG. 10 shows the results. In FIG. 10 the alternate long and short dash line indicates the magnitude of the exchange coupling magnetic field Hs for the reference sample prepared in the second experiment.

As shown in FIG. 10, in any of the respective cases in which the material X of the insertion layers 223 and 225 is Zn, Al, and Cu, when the Co fraction is within a range of 30 to 80 atomic %, the exchange coupling magnetic field Hs becomes smaller as the Co fraction decreases, compared with the case in which the Co fraction is 90 atomic %. This is considered to be because the stability of the fcc structure of CoFe becomes higher as the Co fraction increases. When the Co fraction is 100 atomic %, the exchange coupling magnetic field Hs is much smaller compared with the case in which the Co fraction is 90 atomic %. The reason is considered to be that, when the Co fraction is 100 atomic %, the ferromagnetic material layers 222, 224 and 226 contain a component having a hexagonal close-packed structure and consequently the crystallinity of the spacer layer 23 deteriorates.

As can be seen from FIG. 10, in the case in which the material of the insertion layers 223 and 225 is Zn, it is possible to obtain a greater exchange coupling magnetic field Hs compared with the case without the insertion layers 223 and 225, when the Co fraction is within a range of 50 to 90 atomic %. In the case in which the material of the insertion layers 223 and 225 is Al, it is possible to obtain a greater exchange coupling magnetic field Hs compared with the case without the insertion layers 223 and 225, when the Co fraction is within the range of 50 to 90 atomic %. In the case in which the material of the insertion layers 223 and 225 is Cu, it is possible to obtain a greater exchange coupling magnetic field Hs compared with the case without the insertion layers 223 and 225, when the Co fraction is within a range of 60 to 90 atomic %.

Figure 11:
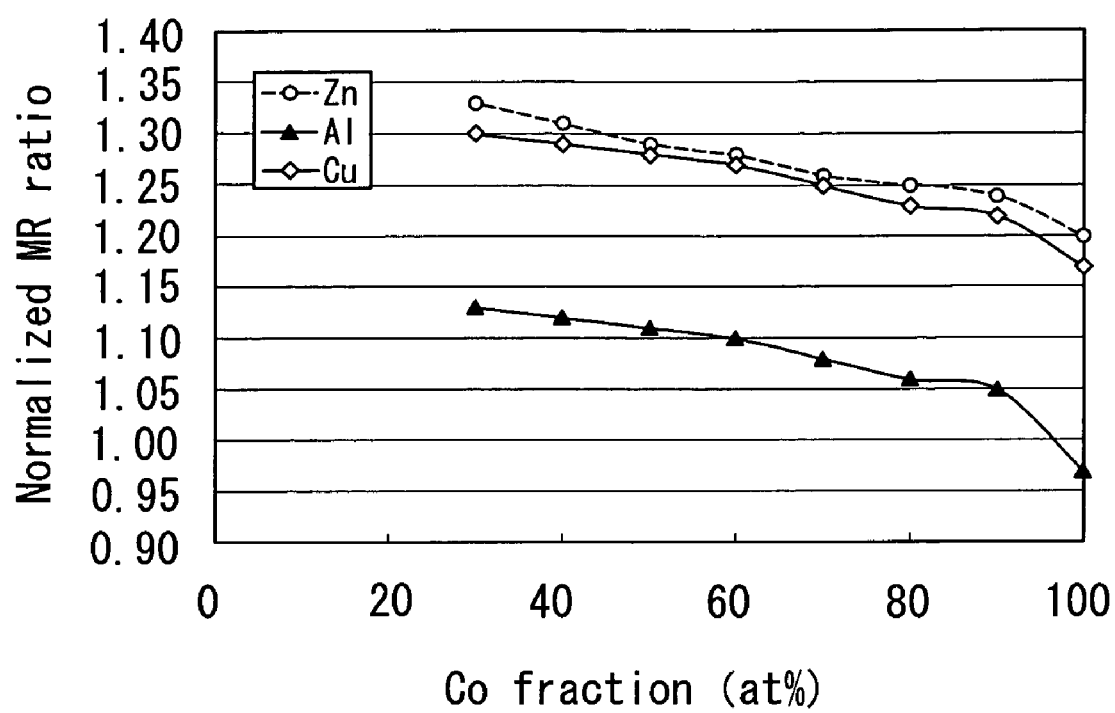
FIG. 11 is a plot illustrating the relationship between the Co fraction in the ferromagnetic material layers and MR ratio determined in the third experiment.

Furthermore, in the third experiment, the MR ratio was measured and the normalized MR ratio was obtained for each of the samples prepared. Then, the relationship between the Co fraction and the normalized MR ratio was determined for each of the respective cases in which the material X of the insertion layers 223 and 225 was Zn, Al, and Cu. FIG. 11 shows the results.

As shown in FIG. 11, in any of the respective cases in which the material X of the insertion layers 223 and 225 is Zn, Al, and Cu, when the Co fraction is within the range of 30 to 80 atomic %, the MR ratio becomes higher as the Co fraction decreases, compared with the case in which the Co fraction is 90 atomic %.

In the case of forming the MR element 5 into the CPP structure for use, as can be seen from FIG. 11, it is possible to obtain a higher MR ratio when CoFe having a higher Fe content than $Co_{90}Fe_{10}$ is used as the material of the ferromagnetic material layers 222, 224 and 226. From the viewpoint of increasing the MR ratio of the MR element 5, it is therefore preferred to use CoFe having a higher Fe content than $Co_{90}Fe_{10}$ as the material of the ferromagnetic material layers 222, 224 and 226. If CoFe having a higher Fe content is used as the material of the ferromagnetic material layers 222, 224 and 226, however, the exchange coupling magnetic field Hs decreases, as can be seen from FIG. 10. Thus, in the case of changing only the composition of CoFe as the material of the ferromagnetic material layers 222, 224 and 226, the MR ratio and the exchange coupling magnetic field Hs are in a trade-off relationship.

Here, if it is possible to greatly increase the exchange coupling magnetic field Hs by providing the insertion layers 223 and 225, it becomes possible to obtain a sufficient magnitude of exchange coupling magnetic field Hs while using a material capable of increasing the MR ratio as the material of the ferromagnetic material layers 222, 224 and 226. It is therefore particularly preferred that the element constituting the insertion layers 223 and 225 be Zn or Al, which is capable of greatly increasing the exchange coupling magnetic field Hs.

Figure 12:
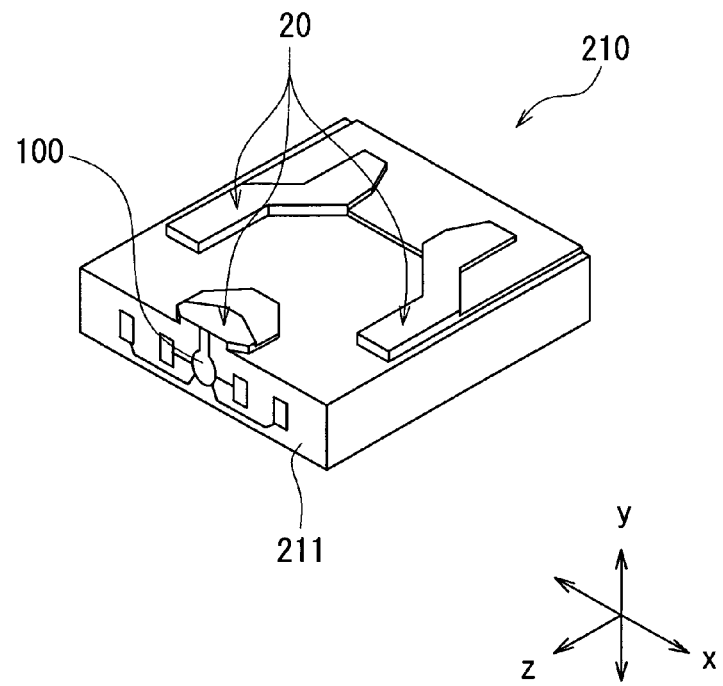
FIG. 12 is a perspective view illustrating a slider incorporated in a head gimbal assembly of the embodiment of the invention.

A head assembly and a magnetic disk drive of the present embodiment will now be described. Reference is first made to FIG. 12 to describe a slider 210 incorporated in the head assembly. In the magnetic disk drive, the slider 210 is placed to face toward a magnetic disk platter that is a circular-plate-shaped recording medium to be driven to rotate. The slider 210 has a base body 211 made up mainly of the substrate 1 and the overcoat layer 17 of FIG. 2. The base body 211 is nearly hexahedron-shaped. One of the six surfaces of the base body 211 faces toward the magnetic disk platter. The medium facing surface 20 is formed in this one of the surfaces. When the magnetic disk platter rotates in the z direction of FIG. 12, an airflow passes between the magnetic disk platter and the slider 210, and a lift is thereby generated below the slider 210 in the y direction of FIG. 12 and exerted on the slider 210. The slider 210 flies over the surface of the magnetic disk platter by means of the lift. The x direction of FIG. 12 is across the tracks of the magnetic disk platter. The thin-film magnetic head 100 of the embodiment is formed near the air-outflow-side end (the end located at the lower left of FIG. 12) of the slider 210.

Figure 13:
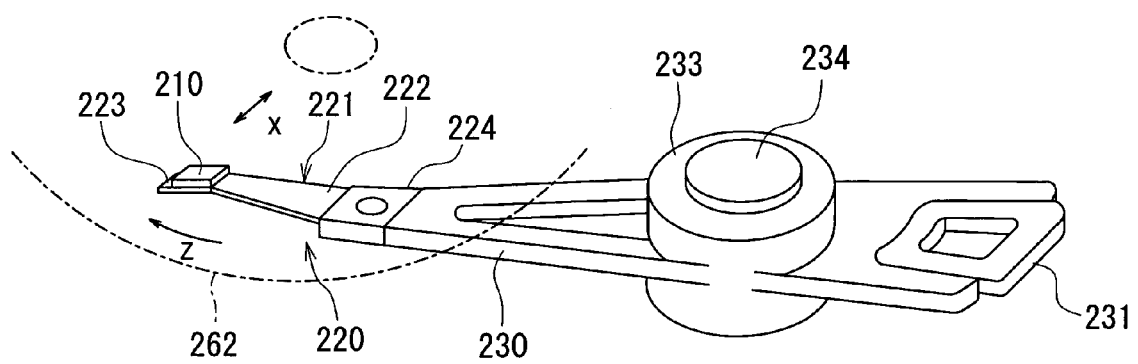
FIG. 13 is a perspective view illustrating a head arm assembly of the embodiment of the invention.

Reference is now made to FIG. 13 to describe the head assembly of the embodiment. The head assembly of the embodiment has the slider 210 and a supporter that flexibly supports the slider 210. Forms of this head assembly include a head gimbal assembly and a head arm assembly described below.

The head gimbal assembly 220 will be first described. The head gimbal assembly 220 has the slider 210 and a suspension 221 as the supporter that flexibly supports the slider 210. The suspension 221 has: a plate-spring-shaped load beam 222 made of stainless steel, for example; a flexure 223 to which the slider 210 is joined, the flexure 223 being located at an end of the load beam 222 and giving an appropriate degree of freedom to the slider 210; and a base plate 224 located at the other end of the load beam 222. The base plate 224 is attached to an arm 230 of an actuator for moving the slider 210 along the x direction across the tracks of the magnetic disk platter 262. The actuator has the arm 230 and a voice coil motor that drives the arm 230. A gimbal section for maintaining the orientation of the slider 210 is provided in the portion of the flexure 223 on which the slider 210 is mounted.

The head gimbal assembly 220 is attached to the arm 230 of the actuator. An assembly including the arm 230 and the head gimbal assembly 220 attached to the arm 230 is called a head arm assembly. An assembly including a carriage having a plurality of arms wherein the head gimbal assembly 220 is attached to each of the arms is called a head stack assembly.

FIG. 13 illustrates the head arm assembly of the embodiment. In the head arm assembly, the head gimbal assembly 220 is attached to an end of the arm 230. A coil 231 that is part of the voice coil motor is fixed to the other end of the arm 230. A bearing 233 is provided in the middle of the arm 230. The bearing 233 is attached to a shaft 234 that rotatably supports the arm 230.

Figure 14:
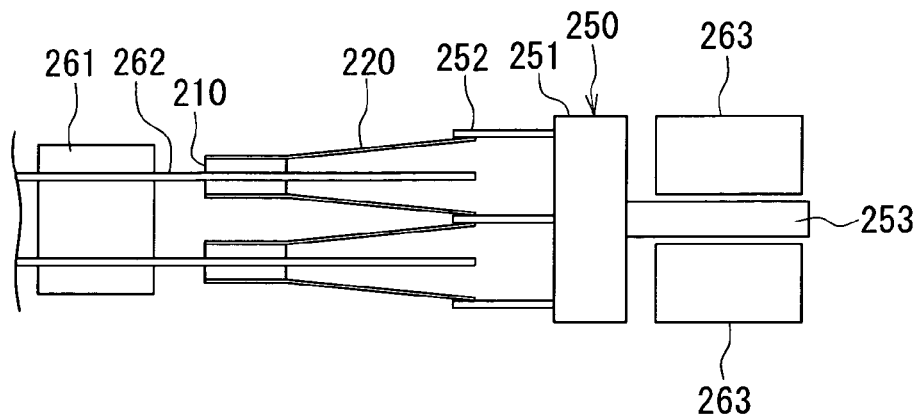
FIG. 14 is an explanatory view for illustrating a main part of a magnetic disk drive of the embodiment of the invention.
Figure 15:
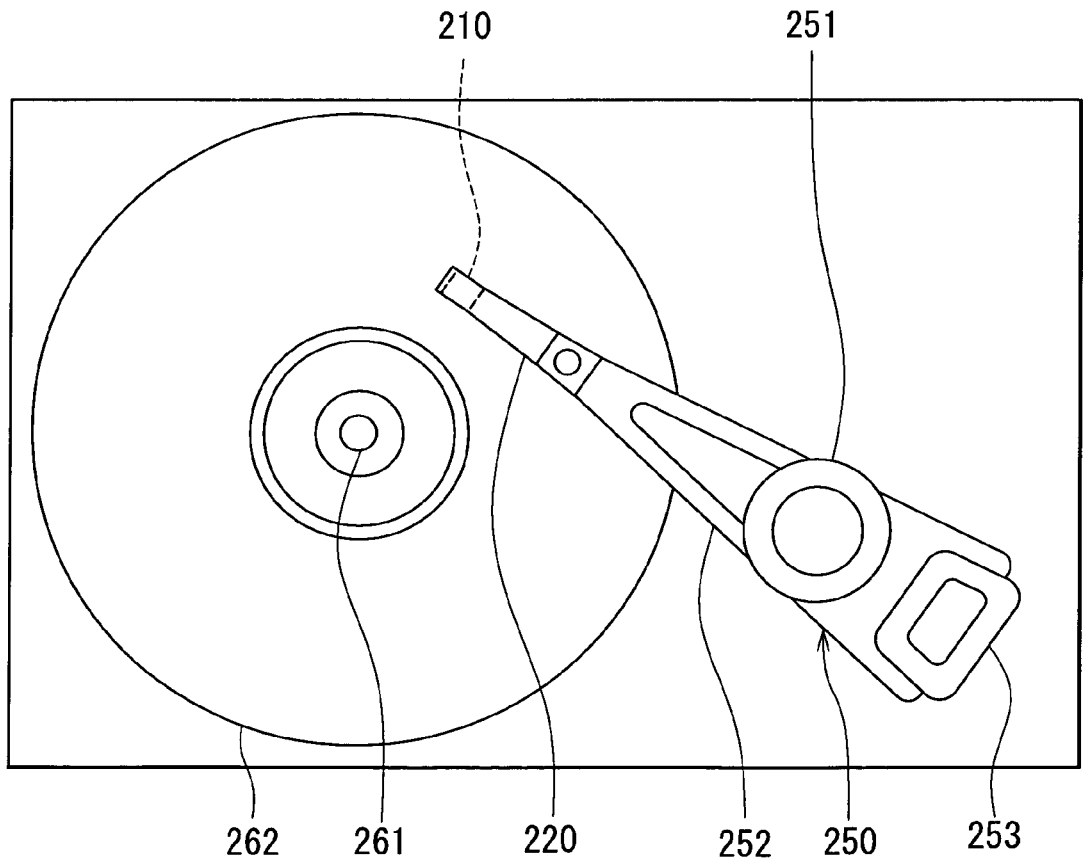
FIG. 15 is a top view of the magnetic disk drive of embodiment of the invention.

Reference is now made to FIG. 14 and FIG. 15 to describe an example of the head stack assembly and the magnetic disk drive of the embodiment. FIG. 14 is an explanatory view illustrating the main part of the magnetic disk drive, and FIG. 15 is a top view of the magnetic disk drive. The head stack assembly 250 incorporates a carriage 251 having a plurality of arms 252. A plurality of head gimbal assemblies 220 are attached to the arms 252 such that the assemblies 220 are arranged in the vertical direction with spacing between respective adjacent ones. A coil 253 that is part of the voice coil motor is mounted on the carriage 251 on a side opposite to the arms 252. The head stack assembly 250 is installed in the magnetic disk drive. The magnetic disk drive includes a plurality of magnetic disk platters 262 mounted on a spindle motor 261. Two of the sliders 210 are allocated to each of the platters 262, such that the two sliders 210 are opposed to each other with each of the platters 262 disposed in between. The voice coil motor includes permanent magnets 263 disposed to be opposed to each other, the coil 253 of the head stack assembly 250 being placed between the magnets 263.

The actuator and the head stack assembly 250 except the sliders 210 correspond to the alignment device of the invention, and support the sliders 210 and align them with respect to the magnetic disk platters 262.

In the magnetic disk drive of the embodiment, the actuator moves the slider 210 across the tracks of the magnetic disk platter 262 and aligns the slider 210 with respect to the magnetic disk platter 262. The thin-film magnetic head incorporated in the slider 210 writes data on the magnetic disk platter 262 by using the write head, and reads data stored on the magnetic disk platter 262 by using the read head.

The head assembly and the magnetic disk drive of the embodiment exhibit effects similar to those of the foregoing thin-film magnetic head of the embodiment.

The present invention is not limited to the foregoing embodiment but can be carried out in various modifications. For example, the material used to form the ferromagnetic material layers of the invention may include another element, such as Ni, in addition to Co and Fe.

In addition, while the foregoing embodiment has been described with reference to a thin-film magnetic head having a structure in which the read head is formed on the base body and the write head is stacked on the read head, the read head and the write head may be stacked in the reverse order. When the thin-film magnetic head is to be used only for read operations, the magnetic head may be configured to include the read head only.

The present invention is applicable not only to MR elements used as read heads of thin-film magnetic heads, but also to MR elements used for various purposes in general.

It is apparent that the present invention can be carried out in various forms and modifications in the light of the foregoing descriptions. Accordingly, within the scope of the following claims and equivalents thereof, the present invention can be carried out in forms other than the foregoing most preferable embodiments.

What is claimed is:

1. A magnetoresistive element comprising a first ferromagnetic layer, a second ferromagnetic layer, and a spacer layer made of a nonmagnetic material and disposed between the first and second ferromagnetic layers, the first and second ferromagnetic layers being antiferromagnetically coupled to each other through the spacer layer, and having magnetizations that are in opposite directions when no external magnetic field is applied thereto and that change directions in response to an external magnetic field, wherein:

the spacer layer and the second ferromagnetic layer are stacked in this order on the first ferromagnetic layer;

the first ferromagnetic layer includes: a plurality of ferromagnetic material layers that are stacked and are each made of a ferromagnetic material; and an insertion layer made of a nonmagnetic material and inserted between respective two of the ferromagnetic material layers that are adjacent to each other along a direction in which the layers are stacked;

the plurality of ferromagnetic material layers and the spacer layer each include a component whose crystal structure is a face-centered cubic structure;

the spacer layer and the insertion layer are each composed of an element having an atomic radius greater than that of at least one element constituting the ferromagnetic material layers.

2. The magnetoresistive element according to claim 1, wherein the plurality of ferromagnetic material layers each include Co and Fe as the at least one element constituting the ferromagnetic material layers, the element constituting the spacer layer is Cu, and the element constituting the insertion layer is Zn.

3. The magnetoresistive element according to claim 1, wherein the plurality of ferromagnetic material layers each include Co and Fe as the at least one element constituting the ferromagnetic material layers, the element constituting the spacer layer is Cu, and the element constituting the insertion layer is Al.

4. The magnetoresistive element according to claim 1, wherein the plurality of ferromagnetic material layers each include Co and Fe as the at least one element constituting the ferromagnetic material layers, the element constituting the spacer layer is Cu, and the element constituting the insertion layer is Cu.

5. A method of manufacturing a magnetoresistive element, the magnetoresistive element comprising a first ferromagnetic layer, a second ferromagnetic layer, and a spacer layer made of a nonmagnetic material and disposed between the first and second ferromagnetic layers, the first and second ferromagnetic layers being antiferromagnetically coupled to each other through the spacer layer, and having magnetizations that are in opposite directions when no external magnetic field is applied thereto and that change directions in response to an external magnetic field, the method comprising the steps of forming the first ferromagnetic layer;

forming the spacer layer on the first ferromagnetic layer; and forming the second ferromagnetic layer on the spacer layer, wherein:

the first ferromagnetic layer includes: a plurality of ferromagnetic material layers that are stacked and are each made of a ferromagnetic material; and an insertion layer made of a nonmagnetic material and inserted between respective two of the ferromagnetic material layers that are adjacent to each other along a direction in which the layers are stacked;

the plurality of ferromagnetic material layers and the spacer layer each include a component whose crystal structure is a face-centered cubic structure;

the spacer layer and the insertion layer are each composed of an element having an atomic radius greater than that of at least one element constituting the ferromagnetic material layers.

6. A thin-film magnetic head comprising: a medium facing surface that faces toward a recording medium; and a magnetoresistive element disposed near the medium facing surface to detect a signal magnetic field sent from the recording medium, the magnetoresistive element comprising a first ferromagnetic layer, a second ferromagnetic layer, and a spacer layer made of a nonmagnetic material and disposed between the first and second ferromagnetic layers, the first and second ferromagnetic layers being antiferromagnetically coupled to each other through the spacer layer, and having magnetizations that are in opposite directions when no external magnetic field is applied thereto and that change directions in response to an external magnetic field, wherein:

the spacer layer and the second ferromagnetic layer are stacked in this order on the first ferromagnetic layer;

the first ferromagnetic layer includes: a plurality of ferromagnetic material layers that are stacked and are each made of a ferromagnetic material; and an insertion layer made of a nonmagnetic material and inserted between respective two of the ferromagnetic material layers that are adjacent to each other along a direction in which the layers are stacked;

the plurality of ferromagnetic material layers and the spacer layer each include a component whose crystal structure is a face-centered cubic structure;

the spacer layer and the insertion layer are each composed of an element having an atomic radius greater than that of at least one element constituting the ferromagnetic material layers.

7. A head assembly comprising: a slider including a thin-film magnetic head and disposed to face toward a recording medium; and a supporter flexibly supporting the slider, the thin-film magnetic head comprising: a medium facing surface that faces toward the recording medium; and a magnetoresistive element disposed near the medium facing surface to detect a signal magnetic field sent from the recording medium, the magnetoresistive element comprising a first ferromagnetic layer, a second ferromagnetic layer, and a spacer layer made of a nonmagnetic material and disposed between the first and second ferromagnetic layers, the first and second ferromagnetic layers being antiferromagnetically coupled to each other through the spacer layer, and having magnetizations that are in opposite directions when no external magnetic field is applied thereto and that change directions in response to an external magnetic field, wherein:

the spacer layer and the second ferromagnetic layer are stacked in this order on the first ferromagnetic layer;

the first ferromagnetic layer includes: a plurality of ferromagnetic material layers that are stacked and are each made of a ferromagnetic material; and an insertion layer made of a nonmagnetic material and inserted between respective two of the ferromagnetic material layers that are adjacent to each other along a direction in which the layers are stacked;

the plurality of ferromagnetic material layers and the spacer layer each include a component whose crystal structure is a face-centered cubic structure;

the spacer layer and the insertion layer are each composed of an element having an atomic radius greater than that of at least one element constituting the ferromagnetic material layers.

8. A magnetic disk drive comprising: a slider including a thin-film magnetic head and disposed to face toward a recording medium that is driven to rotate; and an alignment device supporting the slider and aligning the slider with respect to the recording medium, the thin-film magnetic head comprising: a medium facing surface that faces toward the recording medium; and a magnetoresistive element disposed near the medium facing surface to detect a signal magnetic field sent from the recording medium, the magnetoresistive element comprising a first ferromagnetic layer, a second ferromagnetic layer, and a spacer layer made of a nonmagnetic material and disposed between the first and second ferromagnetic layers, the first and second ferromagnetic layers being antiferromagnetically coupled to each other through the spacer layer, and having magnetizations that are in opposite directions when no external magnetic field is applied thereto and that change directions in response to an external magnetic field, wherein:

the spacer layer and the second ferromagnetic layer are stacked in this order on the first ferromagnetic layer;

the first ferromagnetic layer includes: a plurality of ferromagnetic material layers that are stacked and are each made of a ferromagnetic material; and an insertion layer made of a nonmagnetic material and inserted between respective two of the ferromagnetic material layers that are adjacent to each other along a direction in which the layers are stacked;

the plurality of ferromagnetic material layers and the spacer layer each include a component whose crystal structure is a face-centered cubic structure;

the spacer layer and the insertion layer are each composed of an element having an atomic radius greater than that of at least one element constituting the ferromagnetic material layers.

* * * * *